United States Patent [19]

Hosokawa et al.

[11] Patent Number: 5,614,441

[45] Date of Patent: Mar. 25, 1997

[54] PROCESS OF FOLDING A STRIP LEADFRAME TO SUPERPOSE TWO LEADFRAMES IN A PLURAL SEMICONDUCTOR DIE ENCAPSULATED PACKAGE

[75] Inventors: Ryuji Hosokawa, Yokohama; Satoru Yanagida, Kawasaki, both of Japan

[73] Assignee: Kabushiki Kaisha Toshiba, Kawasaki, Japan

[21] Appl. No.: 434,995

[22] Filed: May 4, 1995

Related U.S. Application Data

[62] Division of Ser. No. 213,586, Mar. 16, 1994, Pat. No. 5,543,658.

[30] Foreign Application Priority Data

Jun. 14, 1993 [JP] Japan ..................................... 5-141790

[51] Int. Cl.⁶ ........................... H01L 21/48; H01L 21/56; H01L 21/58; H01L 21/70
[52] U.S. Cl. ........................... 437/207; 437/217; 437/220
[58] Field of Search ..................................... 437/207, 217, 437/220; 257/666, 724

[56] References Cited

U.S. PATENT DOCUMENTS

| | | | |
|---|---|---|---|
| 4,446,375 | 5/1984 | Aird | 257/666 |
| 4,496,965 | 7/1985 | Orcutt et al. | 257/666 |
| 4,633,582 | 1/1987 | Ching et al. | 257/724 |
| 4,984,065 | 1/1991 | Sako . | |
| 5,049,527 | 9/1991 | Merrick et al. | 257/666 |
| 5,126,823 | 6/1992 | Otsuka et al. | 257/666 |
| 5,147,815 | 9/1992 | Casto | 257/666 |
| 5,299,092 | 3/1994 | Yaguchi et al. | 257/686 |

FOREIGN PATENT DOCUMENTS

| | | |
|---|---|---|
| 63-44750 | 2/1988 | Japan . |
| 1-257361 | 10/1989 | Japan . |
| 2-54248 | 4/1990 | Japan . |
| 2-105450 | 4/1990 | Japan . |
| 5-144991 | 6/1993 | Japan . |

*Primary Examiner*—John Niebling
*Assistant Examiner*—David E. Graybill
*Attorney, Agent, or Firm*—Finnegan, Henderson, Farabow, Garrett & Dunner, L.L.P.

[57] ABSTRACT

A method of manufacturing a semiconductor device wherein, a first lead frame portion has a bed portion for mounting a semiconductor element and a plurality of inner and outer leads. A second lead frame portion has a bed portion for mounting a semiconductor element and a plurality of inner and outer leads as in the first lead frame portion coupled to the second lead frame portion through a coupling portion. The first and second lead frame portions are folded at the coupling portion and superposed such that the two semiconductor elements oppose each other. At this time, the plurality of inner and outer leads of the first and second lead frames are alternately and adjacently arranged. Each electrode of the semiconductor elements is connected to a corresponding inner lead. The superposed first and second lead frames are sealed with a mold resin while leaving end portions of the plurality of outer leads of the first and second lead frames.

4 Claims, 6 Drawing Sheets

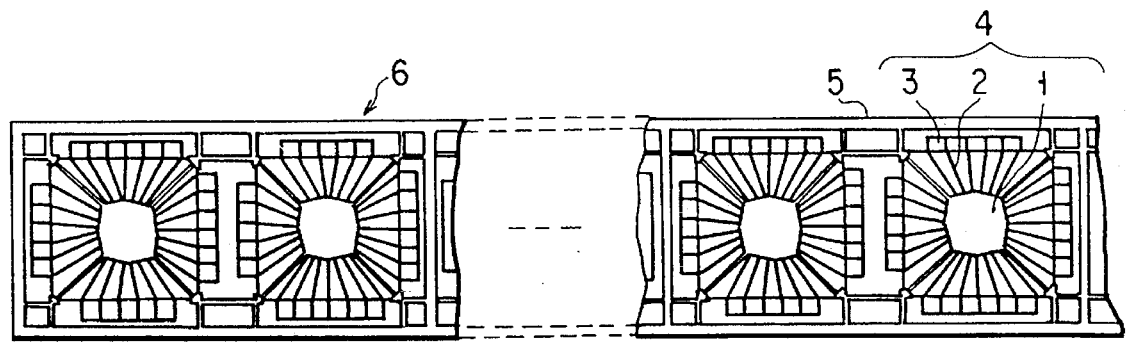
F I G. 1
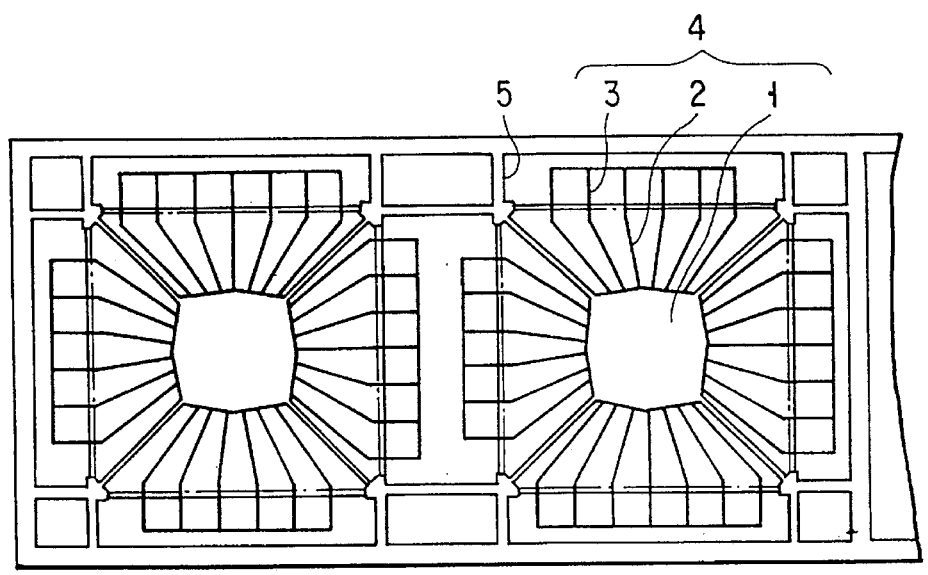
F I G. 2
F I G. 3

PROCESS OF FOLDING A STRIP LEADFRAME TO SUPERPOSE TWO LEADFRAMES IN A PLURAL SEMICONDUCTOR DIE ENCAPSULATED PACKAGE

This is a division of application Ser. No. 08/213,586, filed Mar. 16, 1994, U.S. Pat. No. 5,543,658.

BACKGROUND OF THE INVENTION

1. Field of the Invention

The present invention relates to a method of manufacturing a resin-sealed semiconductor device, which allows easy and correct positioning of semiconductor elements and lead frames, a lead frame used in this method, and a resin-sealed semiconductor device manufactured by this method.

2. Description of the Related Art

As a conventional semiconductor integrated circuit device which realizes a high-density assembly, for example, a device disclosed in Jpn. UM Appln. KOKAI Publication No. 2-54248, Jpn. Pat. Appln. KOKAI Publication No. 2-105450 or 1-257361 is known. Such a semiconductor device has a structure in which a plurality of lead frames, each prepared by mounting and bonding at least one semiconductor chip thereon, are superposed such that the surfaces on which the semiconductor chips are mounted oppose each other, and the leads of the lead frames are compressed and resin-sealed.

However, in the above prior arts, a pair of lead frames to be superposed are positioned every semiconductor chip. For this reason, the manufacturing process is complicated, and correct positioning is not necessarily uniformly performed for each product.

SUMMARY OF THE INVENTION

The present invention has been made in consideration of the above situations, and has as its object to provide a method of manufacturing a resin-sealed semiconductor device, which can uniformly perform more correct positioning for each product not only every semiconductor chip but also when a plurality of semiconductor chips are simultaneously superposed.

It is another object of the present invention to provide a lead frame used in this method of manufacturing a resin-sealed semiconductor device.

It is still another object of the present invention to provide a resin-sealed semiconductor device manufactured by this method of manufacturing a resin-sealed semiconductor device.

In order to achieve the above objects, according to the present invention, there is provided a method of manufacturing a resin-sealed semiconductor device, comprising the steps of preparing a first lead frame portion arranged along a longitudinal direction of a lead frame member and having a first bed portion for mounting a semiconductor element and a first lead group comprising a plurality of inner leads extending in at least one direction around the bed portion and parallelly arranged at substantially equal intervals and a plurality of outer leads respectively connected to the inner leads, and a second lead frame portion having a second bed portion for mounting a semiconductor element and a second lead group comprising a plurality of inner leads and a plurality of outer leads respectively connected to the inner leads, the second lead frame portion being connected to the first lead frame portion through a coupling portion of the lead frame member, the plurality of inner leads and the plurality of outer leads of the second lead group being alternately arranged between the plurality of inner leads and the plurality of outer leads extending in the same direction in the first lead group when the second bed portion is superposed on the first bed portion of the first lead frame portion so as to oppose each other, mounting the first and second semiconductor elements on the first and second bed portions, respectively, and electrically connecting each electrode of the first and second semiconductor elements to a corresponding one of the plurality of inner leads, folding the first and second lead frame portions at the coupling portion to oppose the first and second semiconductor elements each other, and superposing the first and second lead frame portions such that the inner leads and the outer leads of the first and second lead groups are alternately arranged, and sealing the first and second lead frame portions with a mold resin, the first and second lead frame portions including the first and second semiconductor elements opposed each other, while leaving end portions of the outer leads of the first and second lead frame portions.

According to the present invention, there is provided a lead frame comprising a first lead frame portion arranged along a longitudinal direction of a lead frame member and having a first bed portion for mounting a semiconductor element and a first lead group comprising a plurality of inner leads extending in at least one direction around the bed portion and parallelly arranged at substantially equal intervals and a plurality of outer leads respectively connected to the inner leads, and a second lead frame portion having a second bed portion for mounting a semiconductor element and a second lead group comprising a plurality of inner leads and a plurality of outer leads respectively connected to the inner leads, the second lead frame portion being connected to the first lead frame portion through a coupling portion of the lead frame member, and the plurality of inner leads and the plurality of outer leads of the second lead group being alternately arranged between the plurality of inner leads and the plurality of outer leads extending in the same direction in the first lead group when the second bed portion is superposed on the first bed portion of the first lead frame portion so as to oppose each other.

According to the present invention, there is provided a resin-sealed semiconductor device comprising a first lead frame portion comprising a first semiconductor element, a first bed portion for mounting the first semiconductor element, and a first lead group having a plurality of inner leads electrically connected to electrodes of the first semiconductor element, extending in at least one direction around the first semiconductor element, and parallelly arranged at substantially equal intervals, and a plurality of outer leads respectively connected to the plurality of inner leads, a second lead frame portion comprising a second semiconductor element arranged at a portion opposing the first semiconductor element, a second bed portion for mounting the second semiconductor element, and a second lead group having a plurality of inner leads and a plurality of outer leads respectively connected to the plurality of inner leads, the plurality of inner leads and the plurality of outer leads of the second lead group being electrically connected to electrodes of the second semiconductor element, extending in the same direction around the second semiconductor element as in the first lead group, and alternately and adjacently arranged with respect to the plurality of inner leads of the first lead group and the plurality of outer leads respectively connected to the plurality of inner leads, and a mold resin for sealing the first semiconductor element and the second semiconductor element such that end portions of the outer leads of the first lead group and end portions of the outer leads of the second lead group are staggered.

With the above arrangement, according to the method of manufacturing a resin-sealed semiconductor device of the present invention, when the continuous first and second lead frame portions having semiconductor elements mounted on their bed portions are folded at a coupling portion to be superposed, and the two semiconductor elements are opposed each other, easy and correct positioning can be performed for the two semiconductor elements and inner leads and corresponding outer leads.

Especially, when a plurality of semiconductor elements are arranged in the longitudinal direction of the first and second lead frames, the lead frames are folded at the coupling portion. At this time, the plurality of semiconductor elements of the first and second lead frames, which are symmetrically placed on both sides of the coupling portion as a center line and to be opposed, and the inner and outer leads to be alternately arranged are correctly positioned at one time.

Therefore, according to this resin-sealed semiconductor device, not only when a resin-sealed semiconductor device including a single semiconductor chip is manufactured, but also when a plurality of resin-sealed semiconductor devices are manufactured at one time, the semiconductor elements to be opposed and inner and outer leads to be alternately arranged can be correctly positioned.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plan view showing a lead frame for mounting a plurality of semiconductor elements according to the present invention;

FIG. 2 is an enlarged plan view showing a pair of adjacent lead frame portions of the lead frame shown in FIG. 1;

FIG. 3 is a side view showing the lead frame shown in FIG. 2;

DETAILED DESCRIPTION OF THE PREFERRED EMBODIMENTS

Figure 4:
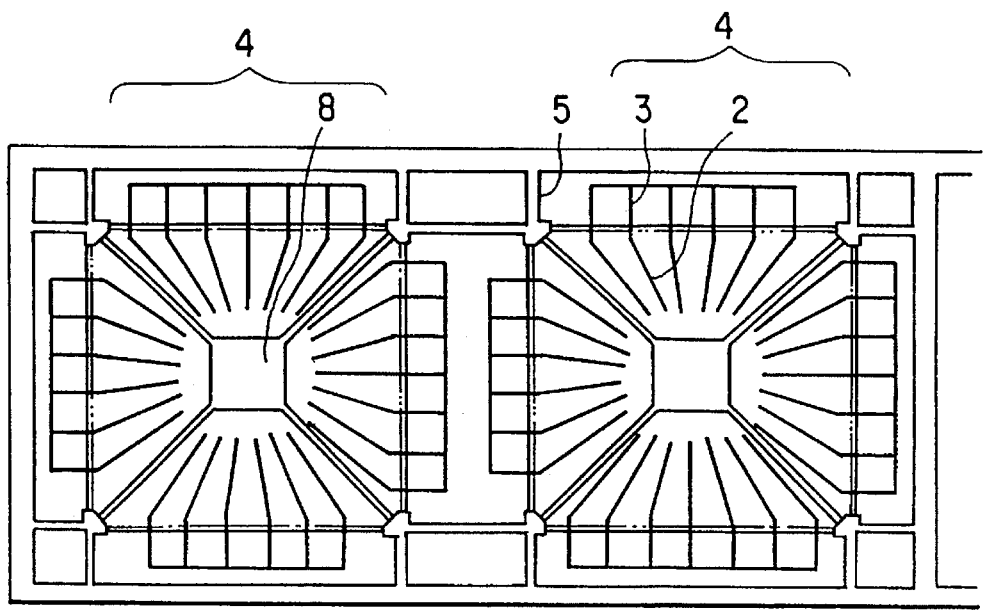
FIG. 4 is a plan view showing the lead frame having beds formed therein.

An embodiment of the present invention will be described below with reference to the accompanying drawings.

As shown in FIG. 1, a unit lead frame is a lead frame portion 4 comprising a portion 1 serving as a bed portion for mounting a semiconductor element, inner leads 2 radially connected to the portion 1, and outer leads 3. A plurality of unit lead frames are coupled to each other by an external frame 5 and arranged at substantially equal intervals to form a lead frame 6.

FIG. 2 is an enlarged view showing frames for two semiconductor elements, which are extracted from the lead frame 6 shown in FIG. 1. The frame portions 4 are coupled to each other by the external frame 5. FIG. 3 is a view showing the lead frame 6 in FIG. 2 when viewed from its side surface. Press-molding is performed at a portion serving as a bed portion, and a recessed portion 7 is formed in the frame portion 4 at a position where the semiconductor element are mounted.

As shown in FIG. 4, a bed is formed and one end portion of each inner lead 2 is cut off to form a bed portion 8. A semiconductor element 9 (to be described later in FIG. 12) is mounted and bonded on the bed portion 8.

Figure 5:
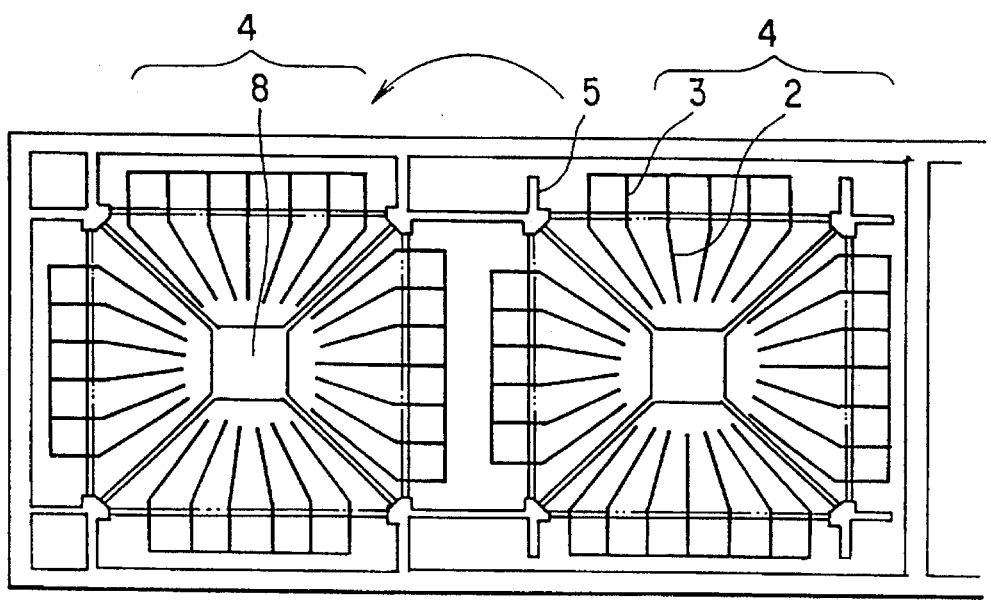
FIG. 5 is a view for explaining that one of the lead frames having the beds is cut off from the external frame and folded in a direction indicated by an arrow.

As shown in FIG. 5, except for the coupling portion between the two unit lead frame portions, the coupling portions between the external frame 5 and one of the unit lead frames 4 are cut off.

The external frame portion 5 for coupling the two unit lead frame portions each having the semiconductor element 9 mounted is folded and superposed.

Figure 6:
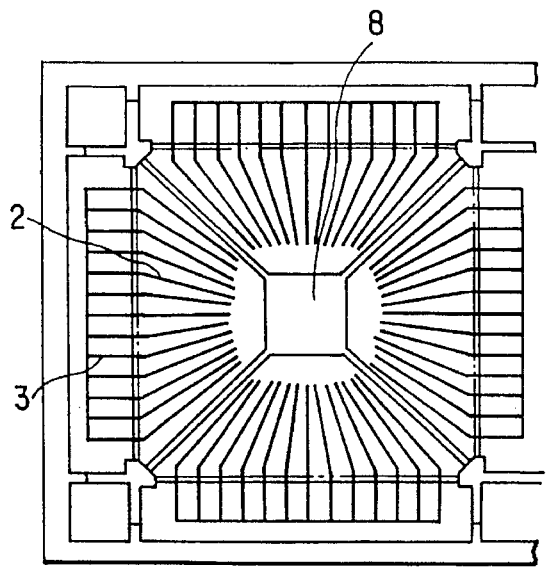
FIG. 6 is a plan view showing the arrangement of inner and outer leads when the adjacent lead frames are superposed.

FIG. 6 shows a state in which the inner leads and the outer leads are alternately arranged when the two unit lead frame portions 4 are superposed. The outer leads 3 of one unit lead frame portion 4 and the outer leads 3 of the other unit lead frame portion 4 are staggered.

Figure 7:
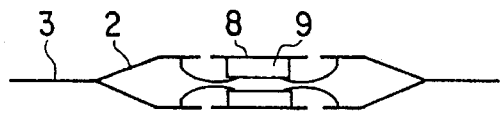
FIG. 7 is a side view showing a state in which the adjacent lead frames each having a semiconductor element mounted are superposed.
Figure 8:
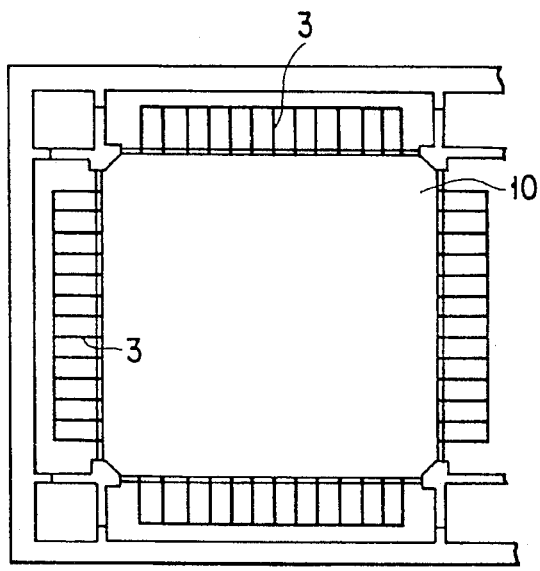
FIG. 8 is a plan view showing a state in which the lead frames shown in FIG. 7 are molded with a resin.

FIG. 7 is a side view showing a state in which the lead frame portions each having the semiconductor element 9 mounted on the bed portion are superposed. The superposed lead frame portions are molded with a resin 10, as shown in FIG. 8, while leaving the outer leads 3.

Figure 9:
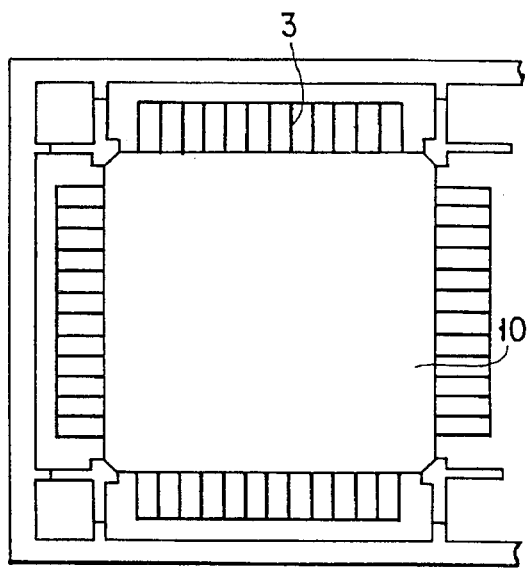
FIG. 9 is a plan view showing a state in which tiebar cutting is performed in the resin-molded lead frames shown in FIG. 8.
Figure 10:
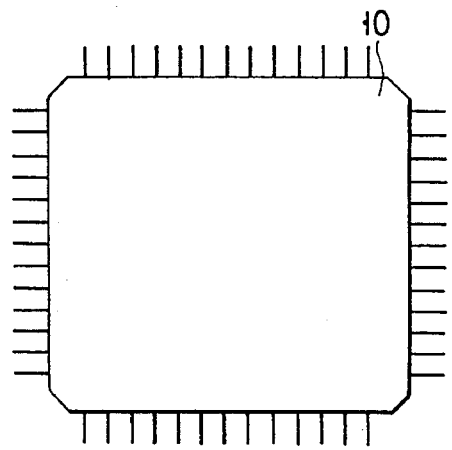
FIG. 10 is a plan view showing a semiconductor device completed by performing cutting and lead forming for the lead frame shown in FIG. 9.
Figure 11:
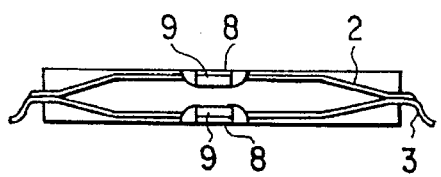
FIG. 11 is a side sectional view showing the semiconductor device shown in FIG. 10.

As shown in FIG. 9, tieber cutting is then performed. As shown in FIGS. 10 and 11, cutting of the coupling portions, lead forming, cutting of the distal ends of the outer leads, and cutting of suspension pins are performed, thereby completing a resin-sealed semiconductor device having a pair of semiconductor elements.

Figure 12:
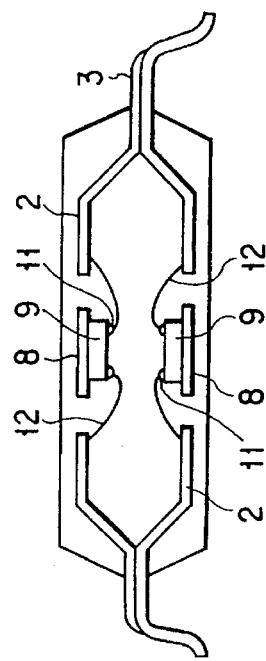
FIG. 12 is a schematic view showing the internal arrangement of the semiconductor device of the present invention.

FIG. 12 shows an enlarged view of the side view in FIG. 11.

As described above, the lead frame portions are folded, the semiconductor elements 9 mounted on the bed portions 8 respectively oppose each other, and electrodes 11 of the semiconductor elements 9 are connected to the inner leads 2 through bonding wires 12, respectively. In addition to the bonding wire 12, a means for electrically connecting may be used.

Figure 13:
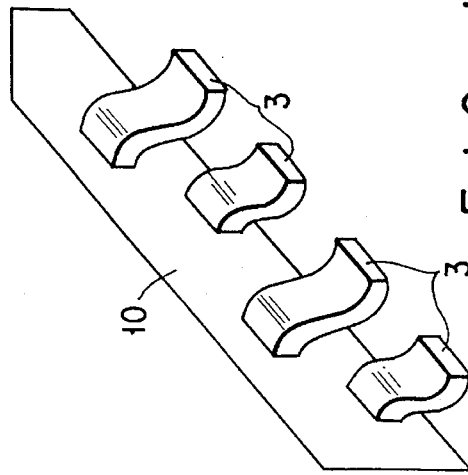
FIG. 13 is an enlarged perspective view showing end portions of the outer leads of the semiconductor device of the present invention.

The outer leads 3 connected to the inner leads 2 and led from the mold resin 10 are staggered, as shown in FIG. 13.

The end portions of the leads are linearly arranged by cutting the distal ends of the outer leads, as shown in FIG. 10.

Figure 14:
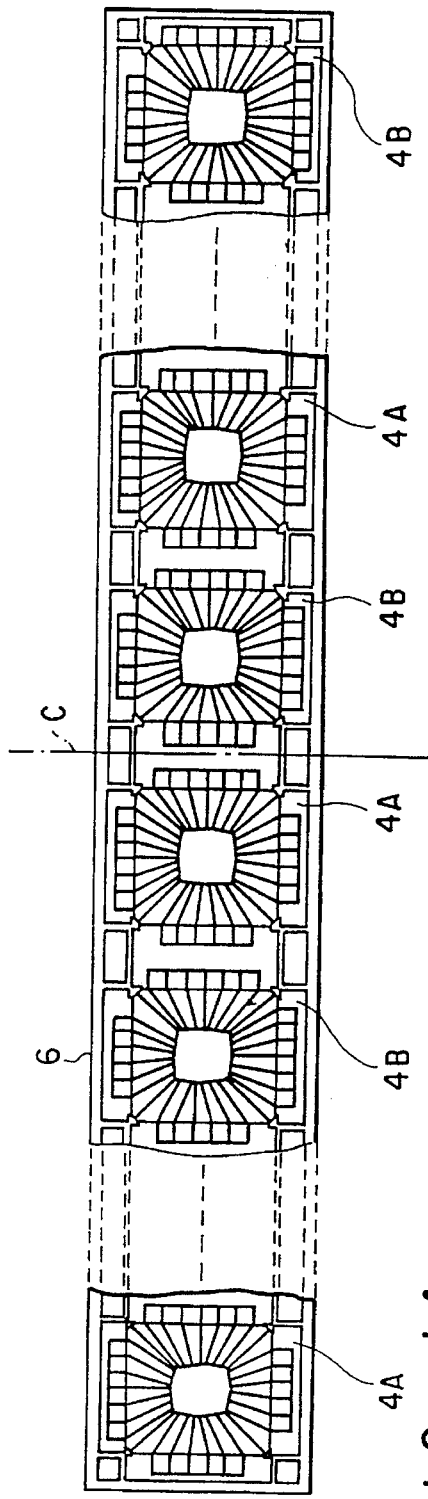
FIG. 14 is a plan view showing a lead frame according to another embodiment of the present invention.

In FIGS. 2 and 13, an example of superposing a pair of unit lead frames 4 is explained for the sake of descriptive convenience. However, as shown in FIG. 14, when a plurality of unit lead frame portions 4 are coupled to each other at coupling portions and held by a common external frame, a plurality of pairs of unit lead frame portions 4 can be superposed at one time by folding a lead frame 6 at its center line C.

In this case, when the lead frame 6 having first and second unit lead frame portions 4A and 4B alternately and adjacently arranged in the longitudinal direction of a frame member is folded at the center line C, the first and second unit lead frame portions 4A, . . . , 4B and 4B alternately arranged in one direction from the center oppose the second and first unit lead frame portions 4B, 4A, . . . and 4A alternately arranged in the other direction from the center.

As a result, in a pair of opposed lead frame portions, a plurality of inner leads and outer leads of the second lead frame portion 4B are alternately arranged between a plurality of inner leads and outer leads of the first lead frame portion 4A.

Figure 15:
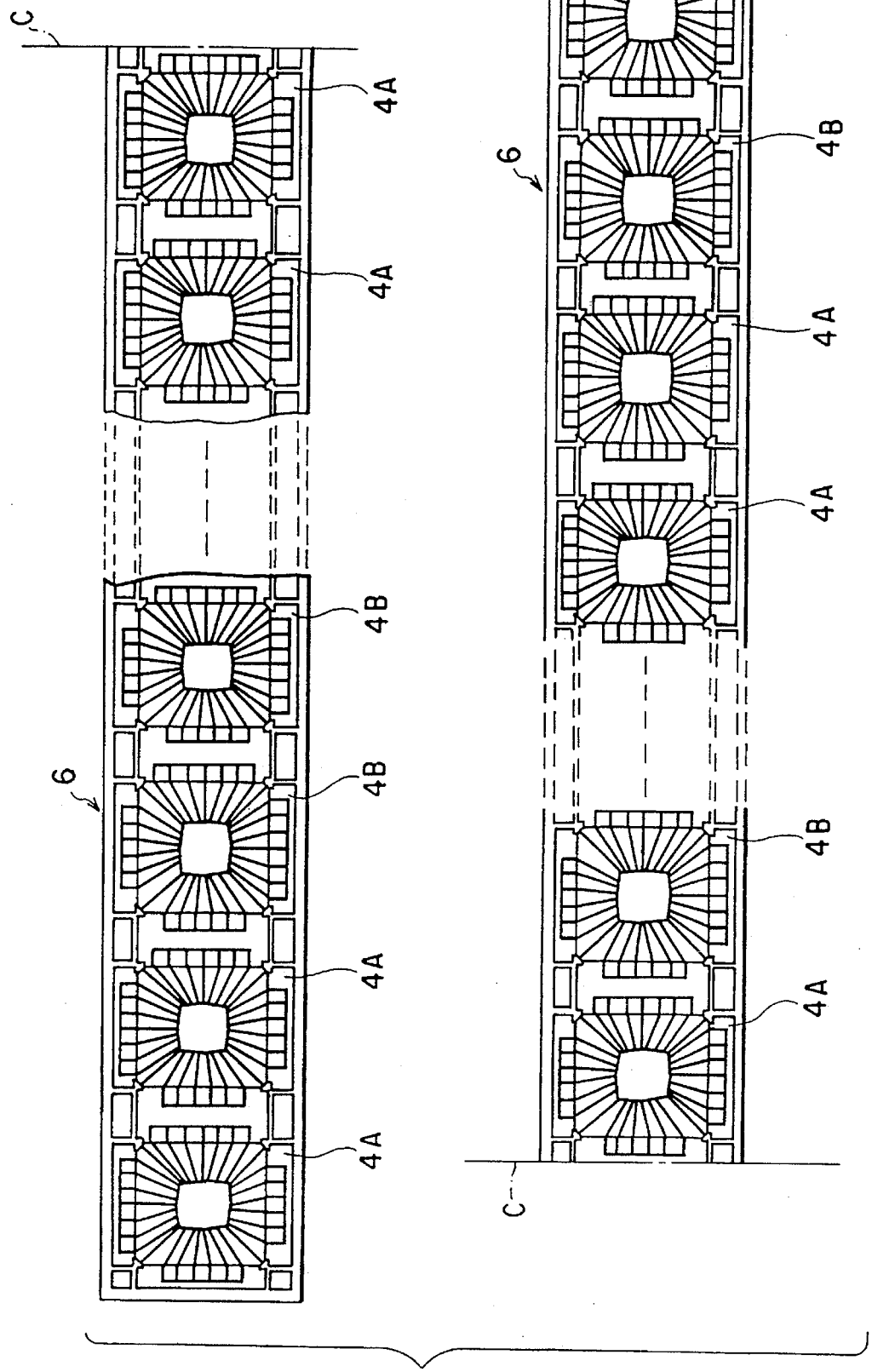
FIG. 15 is a plan view showing a lead frame according to still another embodiment of the present invention.

FIG. 15 shows an embodiment in which a unit constituted by two first lead frame portions 4A, 4A and a unit constituted by two second lead frame portions 4B, 4B are alternately arranged in the longitudinal direction of a lead frame 6. When the lead frame 6 is folded at the center line C, the unit constituted by alternately arranging the two first lead frame portions 4A, 4A and the two second lead frame portions 4B, 4B in one direction from the center opposes the unit constituted by alternately arranging the two second lead frame portions 4B, 4B and the two first frame portions 4A, 4A in the other direction from the center.

The number of lead frame portions 4A and 4B constituting a unit is not limited to two. A unit may be constituted by three or more lead frame portions.

Figure 16:
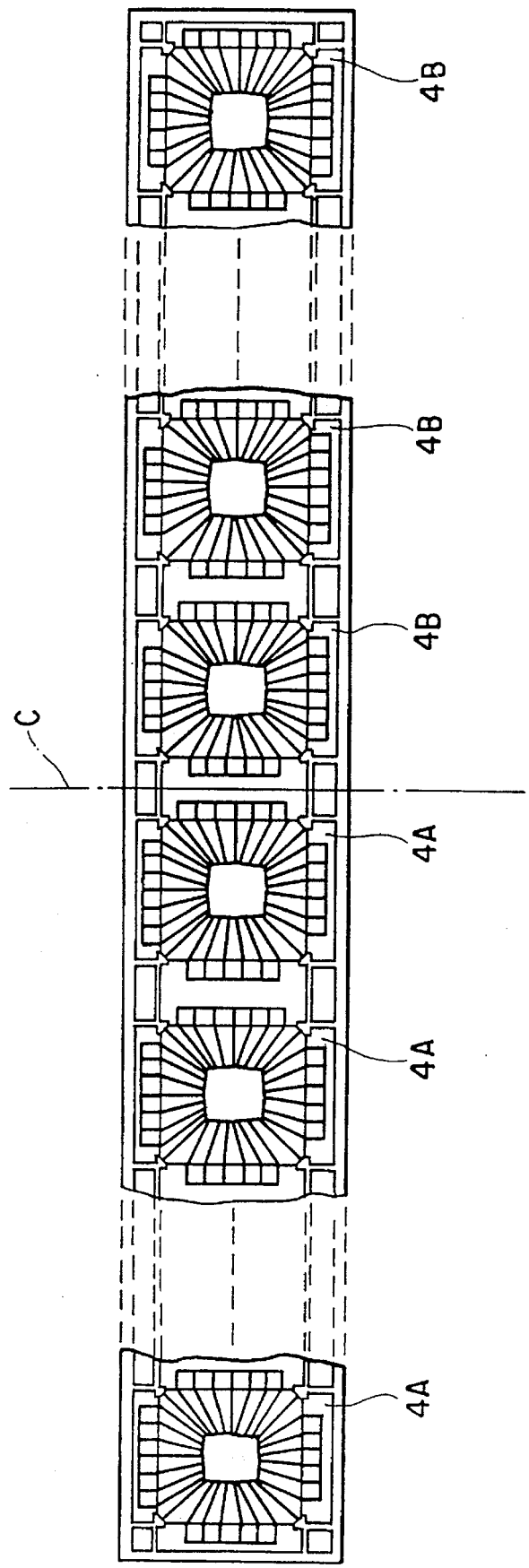
FIG. 16 is a plan view showing a lead frame according to still another embodiment of the present invention.

FIG. 16 shows an embodiment in which two or more first lead frame portions 4A are coupled to each other at coupling portions and adjacently arranged in one direction from the center of a lead frame 6, and two or more second lead frame portions 4B are arranged in the other direction from the center at positions symmetrically with the first lead frame portions 4A.

Also in this embodiment, when the lead frame 6 is folded at the center, a plurality of first lead frame portions 4A, 4A . . . and 4A and a plurality of second lead frame portions 4B, 4B . . . and 4B placed symmetrically with the first lead frame portions are superposed.

In the above embodiments shown in FIGS. 14 to 16, a semiconductor element is mounted on the bed portion of each lead frame portion. When the lead frame is folded at a center line C, correct positioning can be performed and a plurality of semiconductor chips each having a pair of semiconductor elements opposed each other can be continuously obtained.

As in the description of FIG. 8, the lead frame portions 4A and 4B having semiconductor elements mounted are superposed and molded with a resin while leaving the outer leads, thereby obtaining a resin-sealed semiconductor device.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a resin-sealed semiconductor device, comprising the steps of:

preparing a first lead frame portion arranged along a longitudinal direction of a lead frame member and having a first bed portion for mounting a semiconductor element and a first lead group comprising a plurality of inner leads extending in at least one direction around said bed portion and arranged parallel at substantially equal intervals and a plurality of outer leads respectively connected to said inner leads, and a second lead frame portion having a second bed portion for mounting a semiconductor element and a second lead group comprising a plurality of inner leads and a plurality of outer leads respectively connected to said inner leads, said second lead frame portion being connected to said first lead frame portion through a coupling portion of said lead frame member, and the plurality of inner leads and the plurality of outer leads of said second lead group being alternately arranged between the plurality of inner leads and the plurality of outer leads extending in a same direction in said first lead group when said second bed portion is superposed on said first bed portion of said first lead frame portion so as to oppose each other;

mounting said first and second semiconductor elements on said first and second bed portions, respectively, and electrically connecting each electrode of said first and second semiconductor elements to one of the plurality of inner leads;

folding said first and second lead frame portions at said coupling portion to oppose said first and second semiconductor elements, and superposing said first and second lead frame portions such that said inner leads and said outer leads of said first and second lead groups are alternately arranged; and sealing said first and second lead frame portions with a mold resin, said first and second lead frame portions including said first and second semiconductor elements opposed each other, while leaving end portions of said outer leads of said first and second lead frame portions.

2. A method according to claim 1, wherein said first and second lead frame portions are alternately and adjacently arranged in the longitudinal direction of said lead frame member while being coupled at said coupling portion.

3. A method according to claim 1, wherein a unit constituted by not less than two of said first lead frame portions and the same number of second lead frame portions are alternately and adjacently arranged in the longitudinal direction of said lead frame member while being coupled at said coupling portion.

4. A method according to claim 1, wherein at least two of said first lead frame portions are adjacently arranged in one direction from a center of said lead frame member in the longitudinal direction while being coupled at said coupling portion, and at least two of said second lead frame portions are adjacently arranged in the other direction from the center at positions symmetrically with said first lead frame portions while being coupled at said coupling portion.

* * * * *